United States Patent
Asahina et al.

(10) Patent No.: US 6,486,555 B2
(45) Date of Patent: *Nov. 26, 2002

(54) SEMICONDUCTOR DEVICE HAVING A CONTACT STRUCTURE USING ALUMINUM

(75) Inventors: Michio Asahina, Sakata; Junichi Takeuchi, Chino; Naohiro Moriya, Chino; Kazuki Matsumoto, Chino, all of (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,016

(22) Filed: Aug. 26, 1998

(65) Prior Publication Data
US 2002/0014696 A1 Feb. 7, 2002

(30) Foreign Application Priority Data

Aug. 29, 1997 (JP) ............................................. 9-249535
Mar. 3, 1998 (JP) ........................................... 10-067867
Jul. 3, 1998 (JP) ........................................... 10-204396

(51) Int. Cl.$^7$ ......................... H01L 23/48; H01L 23/52
(52) U.S. Cl. ...................... 257/751; 257/763; 257/765; 257/767
(58) Field of Search ................................ 257/751, 753, 257/758, 760, 763, 764, 765, 767, 768, 771; 438/627, 628, 643, 644, 653, 654

(56) References Cited

U.S. PATENT DOCUMENTS

| 5,843,843 A | * | 12/1998 | Lee et al. | 438/688 |
| 5,918,149 A | * | 6/1999 | Besser et al. | 438/680 |
| 6,137,176 A | * | 10/2000 | Morozumi et al. | 257/751 |

FOREIGN PATENT DOCUMENTS

| JP | A-64-76736 | | 3/1989 |
| JP | 6-163877 | * | 6/1994 |

* cited by examiner

Primary Examiner—Tom Thomas
Assistant Examiner—Hung Kim Vu
(74) Attorney, Agent, or Firm—Oliff & Berridge, PLC

(57) ABSTRACT

A method of fabricating a semiconductor device comprises the following steps (a) to (f): (a) a step of forming a the contact hole in an interlayer dielectric formed on a semiconductor substrate including an electronic element; (b) a degassing step for removing gaseous components included within the interlayer dielectric, by thermal processing under a reduced pressure at a substrate temperature of 300° C. to 550° C.; (c) a step of forming a barrier layer on the interlayer dielectric and the contact hole; (d) a step of cooling the substrate to a temperature of no more than 100° C.; (e) a step of forming a first aluminum layer on the barrier layer, at a temperature of no more than 200° C., including aluminum or an alloy in which aluminum is the main component; and (f) a step is of forming a second aluminum layer on the first aluminum layer, at a temperature of at least 300° C., including aluminum or an alloy in which aluminum is the main component.

2 Claims, 7 Drawing Sheets

SEMICONDUCTOR DEVICE HAVING A CONTACT STRUCTURE USING ALUMINUM

BACKGROUND OF THE INVENTION

1. Field of the Invention

The present invention relates to a semiconductor device and a fabrication method therefor, and, in particular, to a semiconductor device that is capable of miniaturization and has a contact structure using aluminum, and to a fabrication method therefor.

2. Description of Related Art

In a semiconductor device such as an LSI, recent advances in miniaturization, integration, and multi-layering of electronic elements have made it necessary to form contact holes with large aspect ratios. An important technical problem that has recently started to cause concern is the difficulty of filling such contact holes with a wiring material. Attempts have been made to fill contact holes with aluminum or an aluminum alloy, which is useful as a wiring material.

One of these techniques is disclosed in Japanese Patent Application Laid-Open No. 64-76730, by way of example. This discloses a fabrication method in which aluminum is made to fill contact holes in a two-step manner, by a technique of first depositing aluminum or an aluminum alloy at a temperature of 150° C. or less, then further increasing the layer of the aluminum or aluminum alloy by bias sputtering.

With this technique, the aluminum of the first layer can be deposited comparatively uniformly and the coverability thereof is improved somewhat, but it is not improved far enough to solve the problem of breakdown of the conductive portions within the contact holes due to causes such as voids.

SUMMARY OF THE INVENTION

An objective of the present invention is use aluminum or an aluminum alloy as a conductive substance within contact holes, to provide a semiconductor device having a contact structure with superlative step coverage, without any voids or broken wiring.

Another objective of the present invention is to provide a method of fabricating such a semiconductor device.

The method of fabricating a semiconductor device of the present invention comprises the following steps (a) to (f);

(a) a step of forming a contact hole in an interlayer dielectric formed on a semiconductor substrate including an electronic element;

(b) a degassing step for removing gaseous components included within the interlayer dielectric, by thermal processing under a reduced pressure at the substrate temperature of 300° C. to 550° C., (c) a step of forming a barrier layer on the interlayer dielectric and the contact hole;

(d) a step of cooling the substrate to a temperature of no more than 100° C.;

(e) a step of forming a first aluminum layer on the barrier layer, at a temperature of no more than 200° C., including one of aluminum and an alloy in which aluminum is the main component; and (f) a step of forming a second aluminum layer on the first aluminum layer, at a temperature of at least 300° C. including at least one of aluminum and an alloy in which aluminum is the main component.

One characteristic of this method of fabricating a semiconductor device is the inclusion within step (b) of a step of removing any gaseous components (the degassing step) that may be comprised within the interlayer dielectric, under special conditions. The inclusion of this degassing step makes it possible to suppress the generation of gases such as water, nitrogen, hydrogen, or oxygen that may be comprised within the interlayer dielectric, during subsequent steps such as the formation of the second aluminum layer under high-temperature conditions of 300° C. or more.

The present inventors have confirmed that gases generated from the interlayer dielectric in such a manner would be adsorbed by the barrier layer but would not be adsorbed by the aluminum layers within contact holes. Therefore, the removal of any gaseous components comprised within the interlayer dielectric in step (b) ensures that deterioration in the wettability of the barrier layer and the generation of voids can be reliably suppressed which are caused by gases lying between the barrier layer and the first aluminum layer. As a result it is possible to form contact portions of low-resistance aluminum within the contact holes, with good coverage.

In this case, "gaseous components" refers to gases that are generated from the deposited layers, that is, the interlayer dielectric and the barrier layer, during conditions of a reduced pressure and a substrate temperature of 300° C. or more, such as water, hydrogen, oxygen, and nitrogen. In addition, "under a reduced pressure" refers to a pressure that is preferably no more than 2.6 Pa; more preferably no more than 1.3 Pa.

With the method of the present invention, the temperature of the substrate is cooled to below 100° C. by this step (d); preferably to between room temperature and 50° C. This cooling of the substrate temperature in step (d) makes it possible to lower the substrate temperature sufficiently before the first aluminum layer is formed. Since the degassing of step (b) is performed at a high substrate temperature of 300° C. or more, lowering the substrate temperature reliably in step (d) ensures that the temperature can be adjusted reliably for the subsequent step (e). The inclusion of this step (d) makes it possible to greatly reduce the amount of gases emitted from the interlayer dielectric, the barrier layer, and also all the surfaces of the wafer during the formation of the first aluminum layer. As a result, it is possible to avoid the effects of harmful gases, which are adsorbed to the boundary surface between the barrier layer and the first aluminum layer, on coverability and adhesiveness.

Forming the first aluminum layer on the barrier layer in step (e) at a temperature of no more than 200° C., preferably 30° C. to 100° C., makes it possible to suppress the emission of gaseous components comprised within the interlayer dielectric and the barrier layer, thus making it possible to prevent any deterioration in the wettability of the barrier layer due to the generation of gases from the barrier layer to outside. As a result, the first aluminum layer can be well adhered to the barrier layer, enabling film formation with good step coverage.

The presence of this first aluminum layer makes it possible to suppress the generation of gases from the interlayer dielectric and the barrier layer that underlie the first aluminum layer, even when the temperature of the substrate rises. As a result, the step (f) of forming the second aluminum layer can be performed at a comparatively high temperature, that is, at a temperature high enough for the aluminum or aluminum alloy to flow and diffuse. More specifically, this second aluminum layer can be formed at a temperature of 300° C. or more; preferably 350° C. to 450° C.

In this manner, it is possible to fill the contact holes with good step coverage but without any voids, by forming the first aluminum layer at a comparatively low temperature in step (e) then forming the second aluminum layer at a comparatively high temperature in step (f). It has also been confirmed that the fabrication method of the present invention can be applied to contact holes of a diameter of 0.2 µm.

It is preferable that a layer, called a wetting layer, is not formed on the surface of the barrier layer. A wetting layer is formed over the surface of the barrier layer to increase its wettability with respect to the conductive substance, for example, when a conductive substance is to fill narrow contact holes that have a diameter of 0.5 µm or less and an aspect ratio of 1 to 4. This is usually formed of a film of a refractory metal, such as titanium. However, the present inventors have confirmed that a film of a metal such as titanium is more likely to comprise water or hydrogen. Therefore, if no such wetting layer is formed on the surface of the barrier layer, the quantity of gaseous components will be less than when there is such a wetting layer, making it possible to suppress the generation of gases that cause voids.

The formation of aluminum layers in steps (e) and (f) is preferably done by a sputtering, and it is further preferable that the first aluminum layer and the second aluminum layer are formed in sequence within the same chamber. Forming the aluminum layers in sequence in the same chamber in this manner facilitates control over the substrate temperature and also enables accurate control over the environment, thus making it possible to avoid problems such as the formation of oxides film on the surface of the first aluminum layer.

Steps (d), (e), and (f) are preferably performed sequentially within the same apparatus having a plurality of chambers and maintaining a reduced-pressure state. This makes it possible to reduce the number of substrate movement and placement steps, which makes it possible to simplify the process and prevent contamination of the substrate.

It is further preferable that the barrier capabilities of the barrier layer are improved by introducing oxygen into the barrier layer after the step of forming the barrier layer in step (c), so as to form oxides of the metal of this barrier layer, in parts of the barrier layer. Methods of introducing oxygen into the barrier layer that could be used include exposing the substrate to an oxygen plasma, or subjecting it to thermal processing in an oxygen environment.

A semiconductor device fabricated by the above fabrication method comprises:
  an interlayer dielectric formed on the semiconductor substrate from which gaseous components have been removed by thermal processing;
  a contact hole formed in the interlayer dielectric;
  a barrier layer formed on the interlayer dielectric and the contact hole; and
  an aluminum layer formed on the barrier layer and including one of aluminum and an alloy in which aluminum is the main component.

This semiconductor device is characterized in having an interlayer dielectric which has had gaseous components removed therefrom by thermal processing, and it has a contact portion formed of aluminum, layers with good step coverage, as described above.

The contact structure of the present invention could be applied as appropriate to a silicide layer formed on the surface of an impurity diffusion layer that configures a source or drain region of a MOS element, but the present invention is not limited thereto and it could equally well be applied to contact with another region on an impurity diffusion layer having no silicide layer.

The contact hole in accordance with the present invention could be formed by anisotropic dry etching, or it could equally well be applied to a configuration in which an upper end portion of a contact hole is formed to have a moderately tapered shape by a combination of isotropic wet etching and anisotropic dry etching. This would be extremely useful because it would make it possible to use a general-purpose sputtering apparatus that does not have high-temperature resources to enable the formation of the second aluminum layer at 300° C. to 350° C., when a contact hole of this type is formed in such a manner that a lower portion thereof is formed by anisotropic dry etching to a diameter of 0.5 to 0.8 µm, with an aspect ratio of between 0.5 and 3.0

PREFERRED EMBODIMENT OF THE INVENTION

Figure 1A:
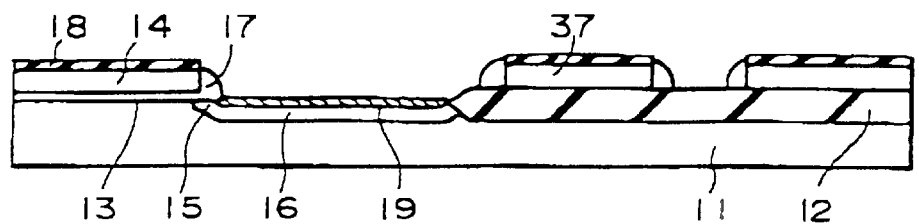
FIGS. 1A to 1C are schematic cross-sectional views showing the processing sequence in an example of the method of fabricating a semiconductor device in accordance with the present invention.
Figure 1B:
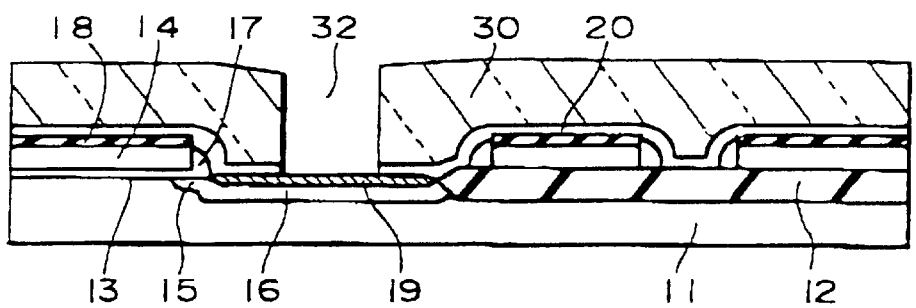
Figure 1C:
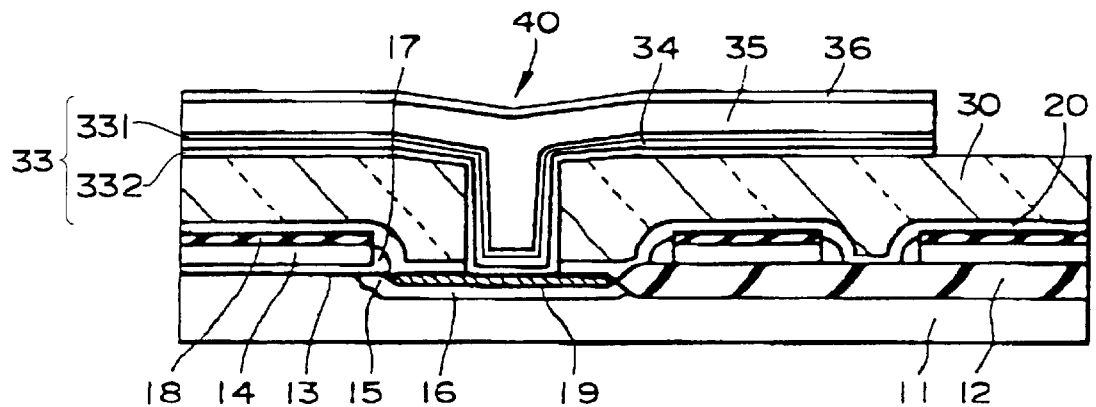

Schematic cross-sectional views that illustrate an embodiment of the method of fabricating a semiconductor device in accordance with the present invention, together with the resultant semiconductor device, are shown in FIGS. 1A to 1C.

An example of this method of fabricating a semiconductor device is described below.

Formation of Electronic Element

A MOS electronic element is first formed on a silicon substrate 11 by a generally used method. More specifically, a field insulation layer 12 is formed on the silicon substrate 11 by selective oxidation and a gate oxide layer 13 is formed in an active region thereof, by way of example. After the threshold voltage has been adjusted by channel implantation, monosilane ($SiH_4$) is thermally decomposed to grow a polysilicon layer, then tungsten silicide is formed by sputtering on that polysilicon layer. A silicon oxide layer 18 is superimposed thereon, and this is etched to a predetermined pattern to form a gate electrode 14. At the same time, a wiring layer 37 is formed from the polysilicon layer and tungsten silicide layer on the field insulation layer 12, if necessary.

A low-density impurity layer 15 for the source or drain region is then formed by the implantation of phosphorus ions. After a side-wall spacer 17 has been formed from the silicon oxide layer on the sides of the gate electrode 14, arsenic ions are implanted, and these impurities are activated by annealing using a Halogen lamp to form a high-density impurity layer 16 for the source or drain region.

A silicon oxide layer of a thickness of no more than 100 nm is then formed by vapor deposition, and a predetermined silicon substrate region is exposed by selectively etching this layer in a mixed aqueous solution of hydrogen fluoride (HF) and $NH_4F$. Subsequently, a titanium monosilicide layer is formed on the surface of the exposed silicon substrate and a titanium-rich titanium nitride (TiN) layer is formed on the silicon oxide layer 18 by, for example, sputtering a layer of titanium of a thickness of approximately 30 to 100 nm thereon, then performing rapid annealing for approximately a few seconds to 60 seconds at a temperature of 650° C. to 750° C. in a nitrogen environment in which oxygen is controlled to be no more than 50 ppm. The wafer is then immersed in a mixed aqueous solution or ammonium hydroxide ($NH_4OH$) and hydrogen peroxide ($H_2O_2$) to etch away this titanium nitride layer, leaving the titanium monosilicide layer only on the surface of the silicon substrate. Lamp annealing at 750° C. to 850° C. is then performed to convert the monosilicide layer to a disilicide, so that the titanium silicide layer 19 is formed in a self-alignment manner on the surface of the high-density impurity layer 16.

Note that if the gate electrode 14 is formed of polysilicon alone and it is exposed by selective etching, a titanium salicide structure is formed where the gate electrode is separated by side-wall spacers from both of the source and drain regions.

Note also that this salicide structure could be fabricated from tungsten silicide or molybdenum silicide, instead of titanium silicide.

Formation of Interlayer Dielectric

Next, a silicon oxide layer 20 is formed as part of the interlayer dielectric to a thickness of 100 to 200 nm by causing a plasma reaction between tetraethoxysilane (TEOS) and oxygen. This silicon oxide layer 20 forms an extremely fine layer with better insulating properties and with a slower etching speed with respect to an aqueous hydrogen fluoride solution than a film grown from monosilane ($SiH_4$), without any oxidation or cusping of the titanium silicide layer 19.

In this case, the silicon oxide layer 20 is formed directly on top of the titanium silicide layer 19. However, if the film-formation temperature is high during this time, the oxidizing gases will easily react with the titanium silicide in the initial stages of the film formation, making cracking and peeling likely to occur, so the processing temperature is preferably 600° C. or less, or more preferably between 250° C. to 400° C. Once the silicon oxide layer has been formed to a thickness of approximately 100 nm on the titanium silicide layer 19 at this comparatively low temperature, raising the temperature to approximately 900° C. for annealing and vapor-phase oxidation performed in a non-steam oxidizing environment will not cause any problems.

A BPSG layer 30 is then formed to a thickness of several hundred nm to 1 $\mu$m on the silicon oxide layer 20 as another part of the interlayer dielectric, by causing a vapor-phase reaction between a silane compound such as $SiH_4$ or TEOS, oxygen or ozone, and a gas containing phosphorus and boron. This layer is subsequently annealed at 800° C. to 900° C. in a nitrogen environment, to planarize it by causing high-temperature flow therein. Note that this planarization of the BPSG layer 30 could also be done by chemical/mechanical polishing (CMP) or by using a commonly used SOG layer, instead of this high-temperature flow.

Formation of Contact Hole

The BPSG layer 30 and the silicon oxide layer 20 that configure the interlayer dielectric are then selectively and anisotropically etched by a reactive ion etcher using $CHF_3$ and $CF_4$ as main gases, to form a contact hole 32 of a diameter of between 0.2 and 0.5 $\mu$m.

Degassing

The wafer is then subjected to thermal processing that includes a degassing step which is the characteristic of the present invention.

Lamp heating (thermal processing A) is performed in a lamp chamber for 30 to 60 seconds at a base pressure of $1\times10^{-4}$ Pa or less and a temperature of 150° C. to 250° C. Then degassing is performed by thermal processing (degassing step: thermal processing B) for 30 to 120 seconds at a temperature of 300° C. to 550° C. in a separate chamber into which argon is introduced at a pressure of 0.1 to 1.0 Pa.

During this procedure, the first thermal processing A heats the entire wafer, including the rear and side surfaces thereof, to enable the removal of any moisture or the like adhering to the wafer.

The subsequent thermal processing B makes it possible to remove gaseous components (oxygen, hydrogen, water, and nitrogen), mainly from within the BPSG layer 30 that forms part of the interlayer dielectric. As a result, the generation of gaseous components from the BPSG layer during the subsequent formation of the barrier and aluminum layers can be prevented.

In the present embodiment, a barrier layer 33 is formed of a multilayer structure comprising a barrier film, which has a barrier function, and a conductive film. The conductive film is formed between the high-resistance barrier film and the impurity diffusion layers formed on the silicon substrate, which are the source and drain regions, to increase the conductivity of the barrier film and the impurity diffusion layers. It is preferable that an ordinary substance is used as the barrier film, for example, nitride such as titanium nitride or cobalt nitride. A refractory metal such as titanium, cobalt, or tungsten can be used as the conductive film. This titanium or cobalt reacts with the silicon of the substrate to form a silicide Since the barrier layer has gaseous components (oxygen, hydrogen, water, and nitrogen) in solid solution therein, which can be several tens of mol % in TiN and Ti films, removing the gaseous components from the BPSG layer 30 of the interlayer dielectric, before the films of the barrier layer are formed, is extremely effective for forming a good aluminum layer within the contact hole. If the gaseous components in the BPSG layer underlying the barrier layer are not removed sufficiently, the gaseous components within the BPSG layer will be released at the temperature achieved during the formation of the barrier layer (ordinarily: 300° C. or more), and these gases will be taken up into the barrier layer. In addition, these gases will be desorbed from the barrier layer and will exit from the boundary surface with the aluminum layer during the formation of the aluminum layer, which will have adverse effects on the adhesiveness and fluidity of the aluminum layer.

Formation of Barrier Layer

A titanium layer is formed by sputtering to a thickness of 20 to 70 nm, as the conductive film 332 of the barrier layer 33, then a TiN film is formed in a separate chamber to a thickness of 30 to 150 nm, as the barrier film 331 of the barrier layer 33. The temperature for this barrier film formation depends on the thickness thereof, but is selected to be within the range of 200° C. to 450° C.

The wafer is then exposed to an oxygen plasma at a pressure of 10 to 100 Pa for 10 to 100 seconds, then it is annealed in a nitrogen or hydrogen environment at 450° C. to 700° C. for 10 to 60 minutes, to form titanium oxide as islands within the barrier layer. This processing has been verified to improve the barrier capabilities of the barrier layer.

This annealing could be performed by thermal processing at 400° C. to 800° C. in a lamp annealing furnace comprising at least several hundred ppm and up to several percent of oxygen, to enable a similar improvement in the barrier capabilities of the barrier layer.

Thermal Processing before Formation of Aluminum Layers

Before the wafer is cooled, thermal processing (thermal processing C) is performed in the lamp chamber at a base pressure of $1.5 \times 10^{-4}$ Pa or less and a temperature of 150° C. to 250° C. for 30 to 60 seconds, to remove substances such as water vapor that may be adhering to the substrate.

Wafer Cooling

Before the aluminum layers are formed, the temperature of the substrate is lowered to below 100° C., preferably to between room temperature and 50° C. This cooling step is important for lowering the substrate temperature that has been increased by the thermal processing C.

This cooling of the wafer ensures that only an extremely small amount of gas escapes from the BPSG layer 30, the barrier layer 33, and all the surfaces of the wafer during the formation of the first aluminum layer. As a result, it is possible to prevent the effects of harmful gases which adsorbs at the boundary surface between the barrier layer 33 and a first aluminum layer 34, on the coverability and adhesiveness thereof.

This cooling step is preferably performed by the sputtering apparatus which is used for forming the aluminum films and has a plurality of chambers of the same structure for forming the aluminum films. For example, the substrate is preferably placed on a stage having a water-cooling function that is provided within the chamber, to lower the temperature of the substrate to a given value. This cooling step is described in detail below.

Figure 2A:
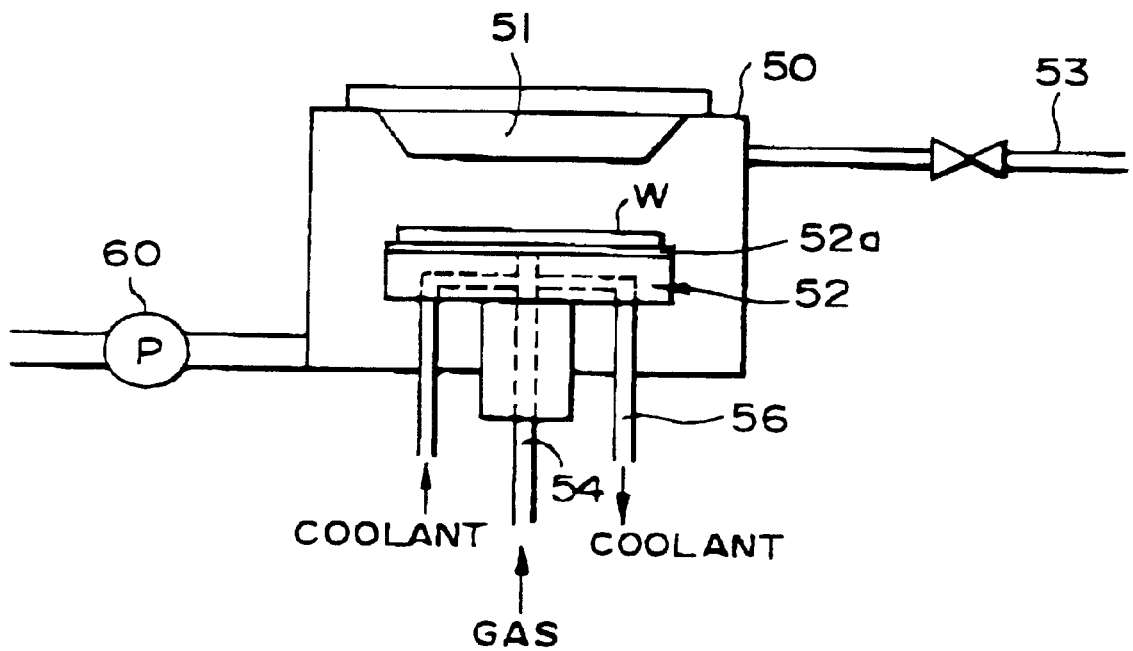
FIG. 2A is a schematic view of an example of the sputtering apparatus used in the present embodiment of the invention and FIG. 2B is a plan view of an example of the stage thereof.
Figure 2B:
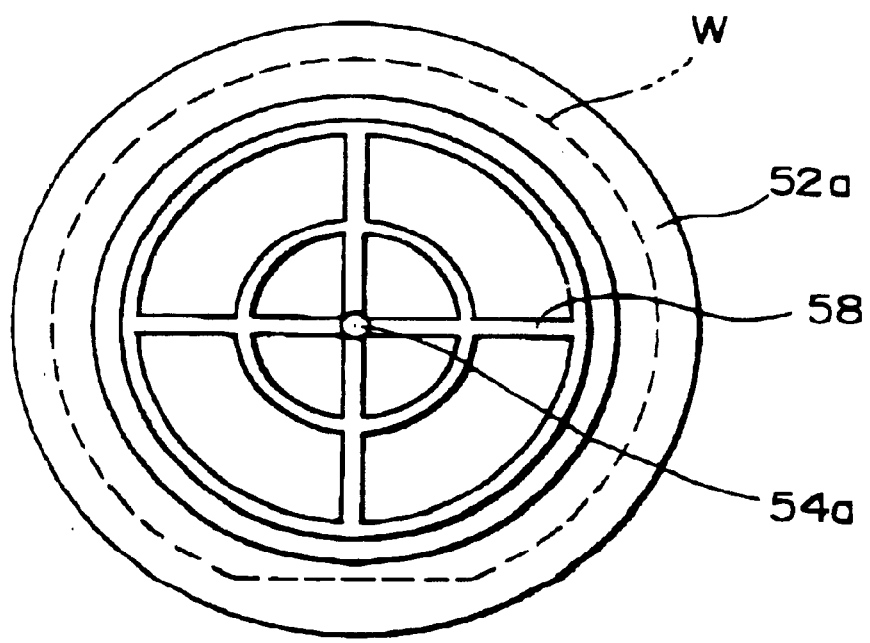

An example of a chamber comprising a stage that has a water-cooling function is shown schematically in FIG. 2A and a plan view of an example of this stage is shown in FIG. 2B.

The sputtering apparatus is provided with a plurality of chambers 50, all of the same structure. Within each chamber 50 is provided a target 51 that also acts as an electrode and an electrode 52 that also acts as a stage, and a wafer W that is to be cooled is placed upon the electrode 52. The chamber 50 is provided with an exhaust means 60 for evacuating the chamber and a first gas supply path 53 for supplying a gas into the chamber. The electrode 52 is configured in such a manner that a given space is formed between the electrode 52 and the wafer W when the wafer W is mounted on the electrode 52. More specifically, a protuberant support portion 52a is provided around an outer peripheral portion of the upper surface of the electrode 52, as shown in FIG. 2B. A second gas supply path 54 is also connected to the electrode 52. A gas that acts as a thermally conductive medium, such as argon, is supplied from the second gas supply path 54 into the space between the electrode 52 and the wafer W. Thus the electrode 52 also acts as a cooling system for cooling the wafer W. The temperature of the electrode 52 is adjusted to a fixed temperature by the flow of a coolant such as water from a coolant supply path 56. To ensure that gas is supplied uniformly to this space, grooves 58 could be formed in the upper surface of the electrode 52, for example as shown in FIG. 2, and an ejection port 54a of the second gas supply path 54 could be provided at a portion at which the grooves intersect.

This chamber operates as described below to cool the wafer.

The interior of the chamber 50 is held in a reduced-pressure state of $6 \times 10^{-6}$ Pa or less by the exhaust means 60 and the wafer W is placed on the support portion 52a of the electrode 52. The gas that is to act as a thermally conductive medium between the electrode 52 and the wafer W is introduced into the space between the electrode 52 and the wafer W from the second gas supply path 54, the pressure in this space is held at 600 to 1000 Pa, and the wafer W is cooled while the gas that escapes from this space is exhausted by the exhaust means 60.

During this cooling of the wafer W, it is necessary to have a certain pressure within the space between the electrode 52 and the wafer w in order to ensure the cooling efficiency. In other words, it is necessary to improve the thermal conductance between the electrode 52 and the wafer W in order to increase the efficiency with which the wafer W is cooled, and it is necessary to increase the pressure of the gas (thermally conductive medium) in the space between the electrode 52 and the wafer W in order to achieve this improvement in efficiency.

Another method that could be considered for cooling the wafer is to place the wafer on a stage that has a cooling mechanism, within a vacuum chamber. With such a cooling process, no gas is supplied directly into the space between the stage and the wafer and the pressure within the space depends on the pressure within the chamber, so it is necessary to increase the pressure within the chamber in order to increase the pressure in the space between the stage and the wafer. However, if the pressure within the chamber is increased to increase the cooling efficiency, the number of gas molecules within the chamber will increase by that amount so that a situation occurs in which the upper surface of the wafer can easily be contaminated by the gas molecules. This harms the reflow of aluminum and can also lead to the generation of voids and an increase in the resistance of the wiring. Conversely, if the pressure within the chamber is reduced to prevent contamination of the wafer, the pressure in the space between the wafer and the stage will drop, which will lower the thermal conductance between the wafer and the stage and, as a result, worsen the cooling efficiency.

With the cooling step of the above embodiment, gases flow between the electrode 52 and the rear surface of the wafer W, which maintains the pressure in the space between the electrode 52 and the wafer W, so that the pressure in this space can be controlled independently of the pressure within the chamber. From the viewpoint of ensuring that there is a thermally conductive medium between the wafer and the stage, the pressure within the chamber can be restricted to between $1 \times 10^{-3}$ and 0.1 Pa, independently of the pressure within this space. This makes it possible to reliably prevent contamination of the upper surface of the wafer by gas molecules and, as a result, improve the reflow characteristics of the aluminum and reduce the resistance thereof. Since the pressure in this spice can be set to within the range of 600 to 1300 Pa without increasing the pressure within the chamber, the thermal conductance can be improved and the cooling efficiency can be increased. In this manner, the cooling step makes it possible to reduce the pressure in the chamber while keeping the pressure in the space between the wafer W and the electrode 52 high, thus making it possible to achieve a good cooling efficiency while preventing contamination of the wafer.

Formation of Aluminum Layers

A film of aluminum comprising 0.2 to 1.0 wt % of copper is first formed at high speed by sputtering to a thickness of 150 to 300 nm at no more than 200° C., more preferably 30° C. to 100° C., to form the first aluminum layer 34. The substrate is then heated within the same chamber to raise the temperature thereof to between 350° C. and 460° C., and a film of aluminum comprising copper is formed at low speed by similar sputtering to a thickness of between 300 and 600 nm, to form a second aluminum layer 35. In this case, the "high speed" used during the formation of the aluminum layers depends on the film-formation conditions or design details of the device being fabricated and thus cannot be specified unconditionally, but as a rule it means a sputtering speed of at least 10 nm/s and "low speed" means a sputtering speed of 3 nm/s or less.

The aluminum sputtering is done in a different chamber within the sputtering apparatus used during the previously described wafer cooling. This chamber has the same structure as that shown in FIGS. 2A and 2B. Thus it is possible to plan for a reduction in the number of substrate movement and placement steps, and, as a result, simplify the process and prevent contamination, by performing the cooling and aluminum film-formation steps within the same apparatus in which a reduced-pressure state is maintained.

In this case, argon is supplied from either the first gas supply path 53 or the second gas supply path 54. The supply of gas from the second gas supply path 54 makes it possible to control the temperature of the wafer W.

Figure 3:
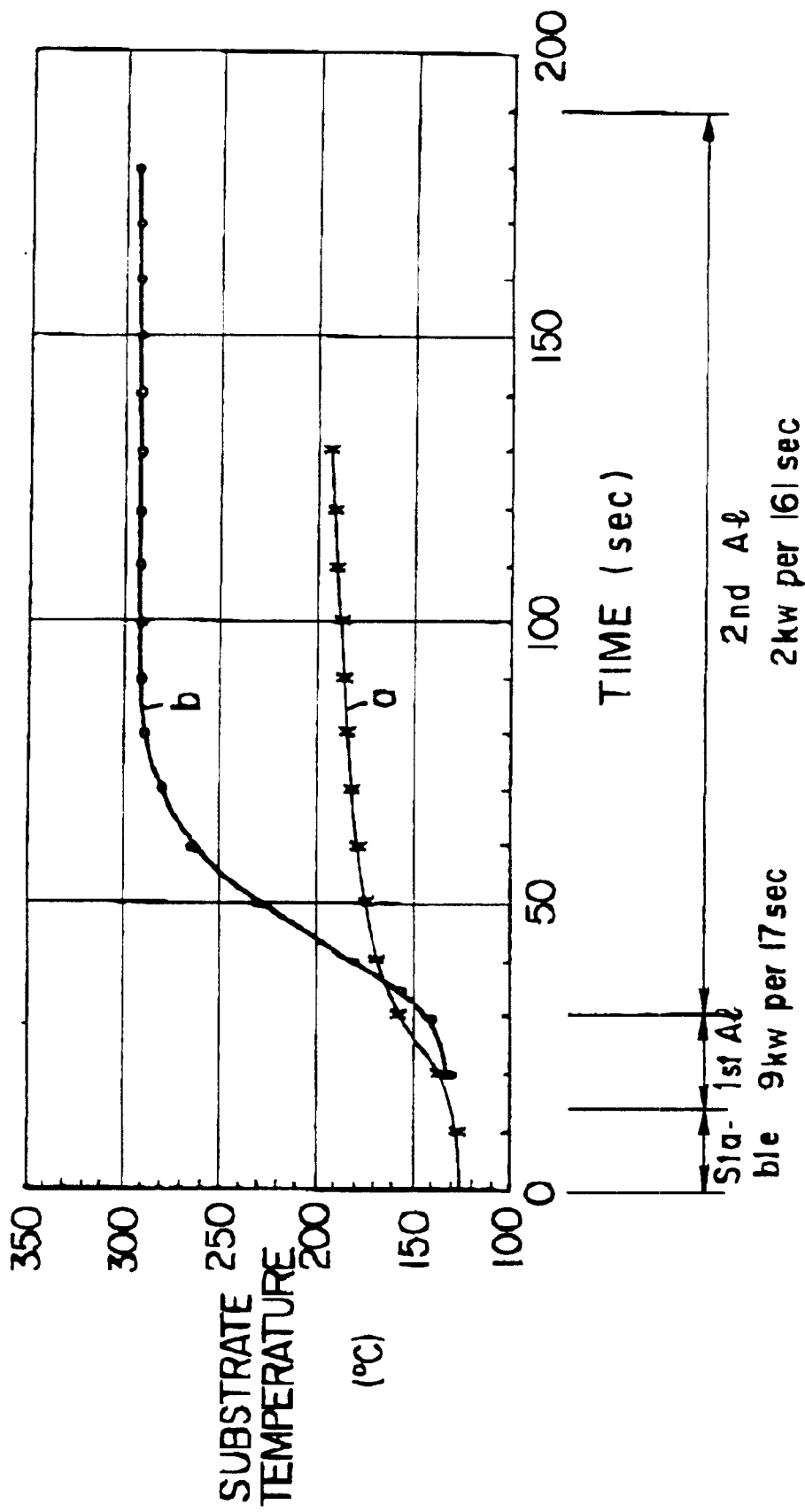
FIG. 3 is a graph of the relationship between time and substrate temperature, when the substrate temperature is controlled by the sputtering apparatus of FIG. 2.

An example of the substrate temperature control achieved by using this sputtering apparatus is shown in FIG. 3. In this graph, elapsed time is plotted along the horizontal axis and substrate (wafer) temperature is plotted along the vertical axis. Reference letter a in FIG. 3 denotes the changes in substrate temperature when the temperature of the stage 52 of the sputtering apparatus is set to be 350° C., and reference letter b denotes the changes in substrate temperature when the temperature of the stage 52 is increased by supplying high-temperature argon through the second gas supply path 54 into the chamber.

The temperature could be controlled as described below, by way of example. First of all, the temperature of the stage 52 is previously set to the temperature for forming the second aluminum layer (350° C. to 500° C.). During the formation of the first aluminum layer, there is no supply of gas from the second gas supply path 54, so the substrate is heated by the stage 52 and thus the temperature rises gradually as shown by reference letter a in FIG. 3. During the formation of the second aluminum layer, the temperature of the substrate is controlled by the supply of heated gas through the second gas supply path 54 so that it rises steeply and is held constant at a predetermined value, as shown by reference letter b in FIG. 3.

In the example shown in FIG. 3, the first aluminum layer 34 is formed while the stage temperature is set to 350° C. and the substrate temperature is set to between 125° C. and 150° C., and the second aluminum layer 35 is formed immediately afterwards.

Controlling both the film-formation speed and the substrate temperature during the formation of the aluminum layers is important for controlling the power applied to the sputtering apparatus. In other words, the film-formation speed is also relevant in that it is important that the power does not fall to zero during the switching between high and low power while the first aluminum layer 34 is being formed at high power and the second aluminum layer 35 is being formed at low power. If the power falls to zero, an oxide layer will form on the surface of the first aluminum layer under the reduced pressure, deteriorating the wettability of the second aluminum layer with respect to the first aluminum layer and worsening the adhesiveness therebetween. In other words, applying the power constantly ensures that active aluminum is supplied continuously to the surfaces of the aluminum layers during the film formation, making it possible to suppress the formation of oxide layers. Note that the magnitude of the power depends on factors such as the sputtering apparatus and film-formation conditions, and thus cannot be specified unconditionally, but it is preferable to have a high power level of 5 kW to 10 kW and a low power level of 300 W to 1 kW under the temperature conditions shown in FIG. 3, by way of example.

The temperature and power can be controlled strictly by forming the first aluminum layer 34 and the second aluminum layer 35 consecutively within the same chamber in this manner, making it possible to form the aluminum layers efficiently at a lower temperature and more stably than in the conventional art.

Since the first aluminum layer 34 can be fabricated from successive layers with good step coverage, and also since the escape of gaseous components from the barrier layer 33 and the BPSG layer 30 forming the interlayer dielectric underneath this aluminum layer 34 can be suppressed, it is preferable to select an optimal range for the thickness of the first aluminum layer 34 to be 200 to 400 nm, for example. For the second aluminum layer 35, the thickness is determined by factors such as the size and aspect ratio of the contact hole, so a thickness of 300 to 1000 nm is necessary for creating a hole of 0.5 $\mu$m or less with an aspect ratio of 3.

Formation of Reflection Prevention Layer

A reflection prevention layer 36 of a thickness of 30 to 80 nm is then formed by the deposition of TiN by sputtering in a separate sputtering chamber. The stack consisting of the barrier layer 33, the first aluminum layer 34, the second aluminum layer 35, and the reflection prevention layer 36 is selectively etching by an anisotropic dry etcher using mainly $Cl_2$ and $BCl_3$ as gases, to pattern a metal wiring layer 40 therefrom.

It has been confirmed that a contact hole of a diameter of 0.2 to 0.8 $\mu$m and with an aspect ratio of 0.5 to 3 can be filled with aluminum by the thus-formed metal wiring layer 40, with good step coverage and without creating any voids.

EXPERIMENTAL EXAMPLES

1. Experiments were performed to investigate differences in the quantity (partial pressure) of gases emitted from wafers, both with and without the degassing step, with the results being as shown in FIGS. 4 and 5.

Figure 4:
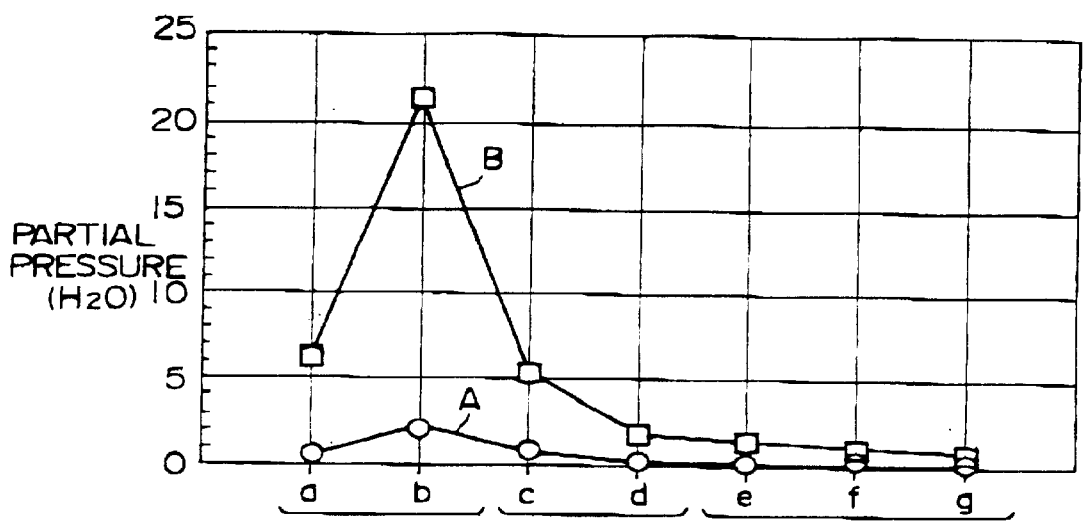
FIG. 4 is a graph of the relationship between process timing and partial pressure of gas (water vapor) remaining within the chamber, in the method of fabricating a semiconductor device in accordance with the present invention.
Figure 5:
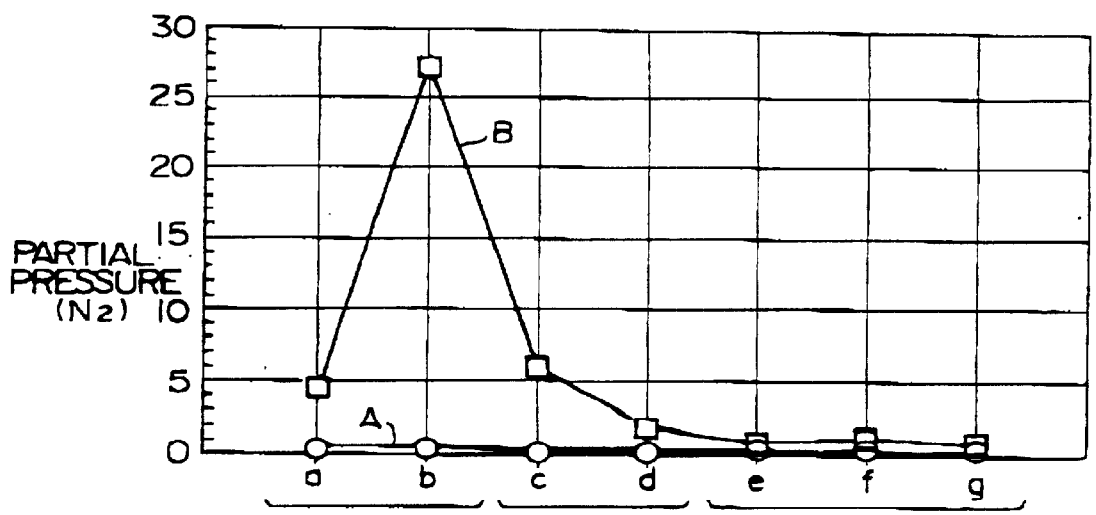
FIG. 5 is a graph of the relationship between process timing and partial pressure of gas (nitrogen) remaining within the chamber, in the method of fabricating a semiconductor device in accordance with the present invention.

In each of FIGS. 4 and 5, timing of the thermal processing performed before the aluminum layers are formed (thermal processing C) up until after the formation of the second aluminum layer 35 is plotted along the horizontal axis and the partial pressure of gas remaining within the chamber is plotted along the vertical axis. In each of these graphs, a line denoted by reference letter A represents the results when the degassing step is performed after the formation of the interlayer dielectric and a line denoted by reference letter B represents the results when no degassing step is performed after the formation of the interlayer dielectric. In these experimental examples, the degassing step was performed at a pressure of 0.27 Pa and a temperature of 460° C., for 120 seconds.

In each of these graphs, reference letters a and b on the horizontal axis represent the timing of the thermal processing C (in a first chamber) before the formation of the aluminum layers, where reference letter a is the time directly after the wafer has entered the first chamber and reference letter b is the time after the wafer has been heated to 250° C. by a lamp for 60 seconds. The pressure within the first chamber is set to $2.7 \times 10^{-6}$ Pa.

Reference letters c and d represent the timing of the wafer-cooling step (in a second chamber), where reference letter c is the time directly after the wafer has entered the second chamber and reference letter d is the time after the temperature of the wafer has been cooled to 20° C. The pressure within the second chamber is set to 0.27 Pa. The pressure within this chamber was reduced to $2.7 \times 10^{-6}$ Pa during the measurement of partial pressures.

Reference letters e, f, and g represent the timing of the steps of forming the aluminum layers (in a third chamber), where reference letter e is the time directly after the wafer has entered the third chamber, reference letter f is the time directly after the formation of the first aluminum layer, and reference letter g is the time directly after the formation of the second aluminum layer. The pressure within the third chamber is set to 0.27 Pa. The pressure within this chamber was reduced to $2.7 \times 10^{-6}$ Pa during the measurement of partial pressures.

It is clear from FIGS. 4 and 5 that the subjecting of a degassing step after the formation of the interlayer dielectric and before the formation of the barrier layer ensures that substantially no water or nitrogen is generated during the subsequent thermal processing and the formation of the aluminum layers. In contrast thereto, if this degassing step is not performed, it is clear that large quantities of both water and nitrogen are emitted during the subsequent thermal processing, particularly during the thermal processing C indicated by reference letter b.

2. When experiments were performed to investigate whether or not the presence of a wafer-cooling step had any effect on the formation of the aluminum layers, the conclusions described below were obtained. Note that the aluminum layers were formed under conditions of a contact hole aspect ratio of 3.18 and an interlayer dielectric thickness of 1148 nm.

Figure 8A:
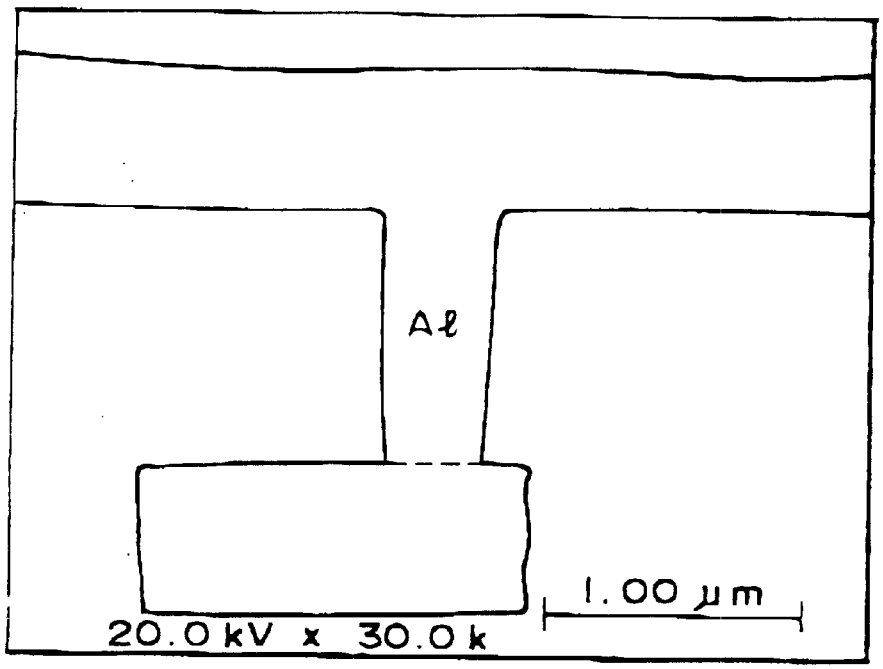
FIG. 8A is a drawing based on an electron micrograph of a cross-section through a wafer in which the aluminum layers are formed after the wafer has been cooled.
Figure 8B:
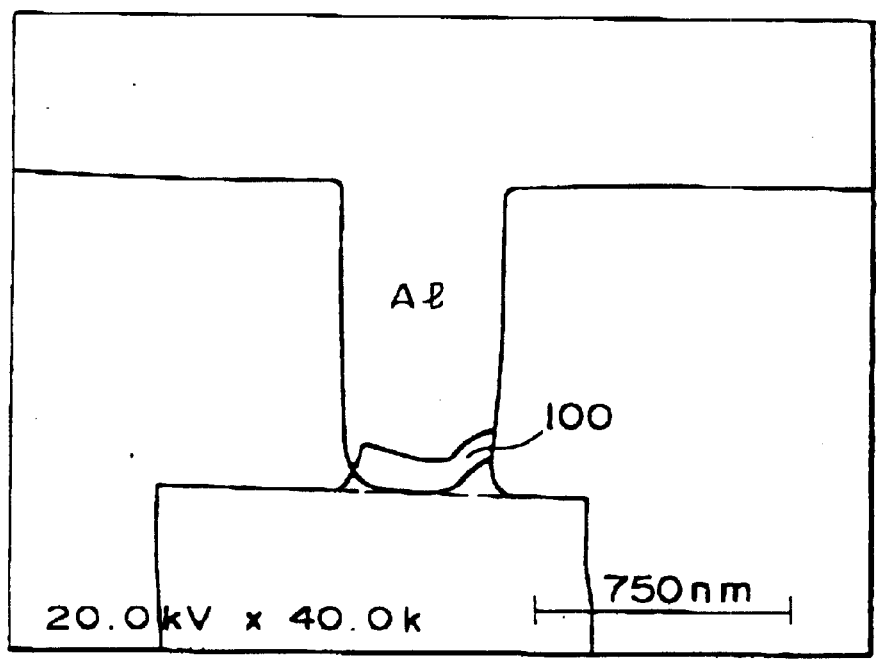
FIG. 8B is a drawing based on an electron micrograph of a cross-section through a wafer in which the aluminum layers are formed after the wafer has not been cooled.

FIG. 8A shows an electron micrograph of a cross-section through a wafer when the wafer was cooled from the temperature 120° C. of the thermal processing C to 20° C., then aluminum layers were formed. FIG. 8B shows an electron micrograph of a cross-section through a wafer when the wafer was not cooled and the aluminum layers were formed at the temperature 120° C. of the thermal processing C.

When a comparison was done after the formation of the aluminum layers between the substrate wherein the wafer was cooled and the substrate wherein the wafer was not cooled, it was found that the first and second aluminum layer (Al) filled each contact hole in the cooled wafer in an extremely favorable manner, as shown in FIG. 8A. In contrast, approximately 30% of the contact holes in wafers that had not been cooled exhibited a lack of complete filling of the aluminum into the base portions of the contact holes, so that a space (void) 100 was formed there, as shown in FIG. 8B.

3. The results of measurements obtained by secondary ion mass spectroscopy (SIMS) after testpieces were irradiated with cesium primary ions are shown in FIGS. 6 and 7.

Figure 6:
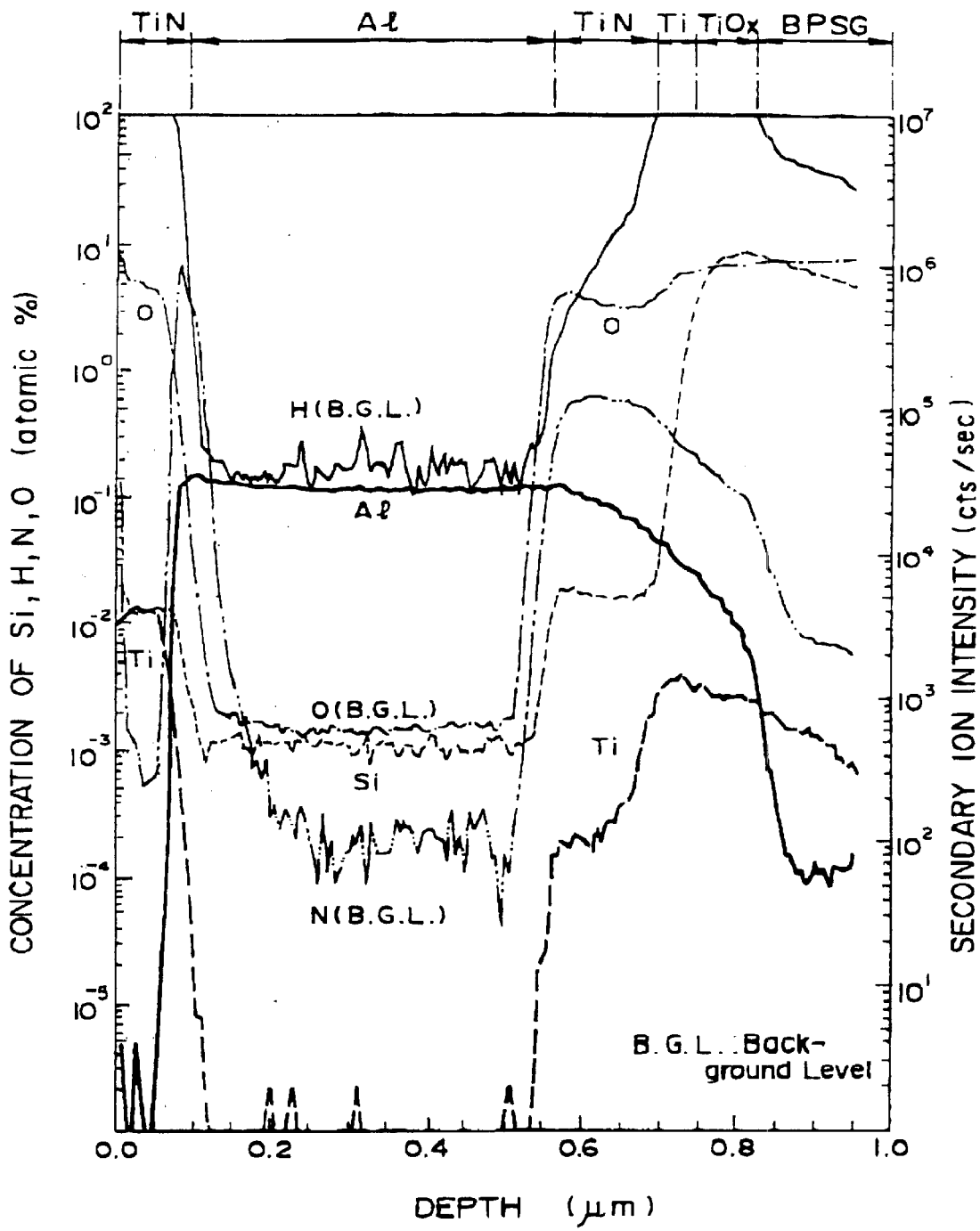
FIG. 6 shows SIMS data obtained for a layer structure having no wetting layer.
Figure 7:
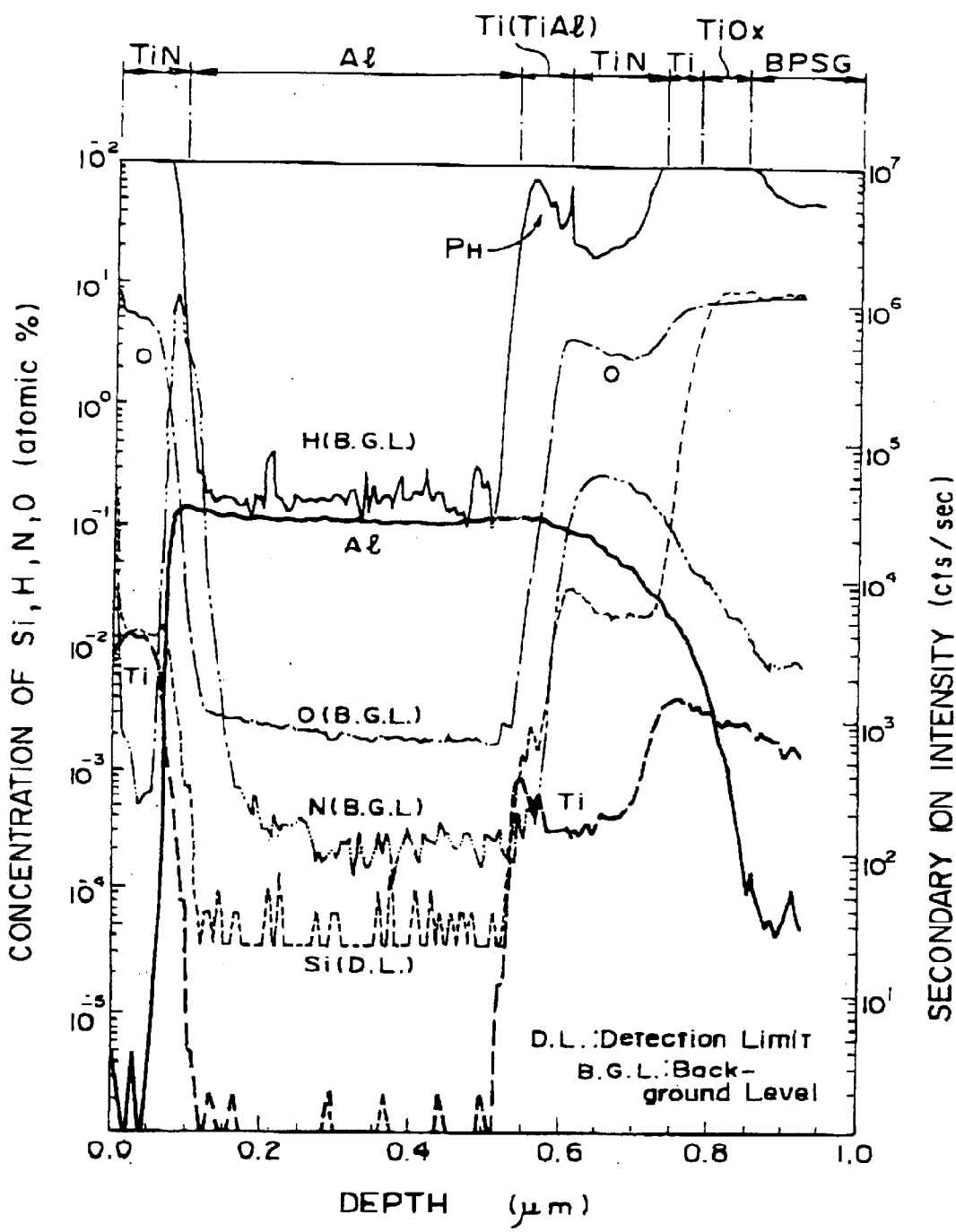
FIG. 7 shows SIMS data obtained for a layer structure having a wetting layer.

FIG. 6 shows data of a stack with multi-layer structures in the sequence TiN film/Al film/TiN film/Ti film, where there was no wetting layer between the barrier layer and the first aluminum layer, and FIG. 7 shows data of a stack with multi-layer structure in the sequence TiN film/Al film/Ti film/TiN film/Ti film, where there was a wetting layer of titanium between the barrier layer and the first aluminum layer. In FIGS. 6 and 7, the quantities of hydrogen, nitrogen, and oxygen in the aluminum layers are plotted along the left-hand vertical axis and the secondary ion intensity in layers other than the aluminum layers is plotted along the right-hand vertical axis.

Note that the experimental samples of FIG. 6 were fabricated by the method described above, except that the degassing step was omitted. The experimental samples of FIG. 7 differed from those of FIG. 6 in that there was a titanium layer under the aluminum layer.

It was determined from FIGS. 6 and 7 that the quantities of hydrogen, oxygen, and nitrogen in the aluminum layers were below the minimum concentration that is detectable by SIMS, which is the background level, meaning that substantially none of these substances were in solid solution.

When there was a wetting layer (titanium layer), there was a large peak of hydrogen (H) within the layer, as denoted by reference letter $P_H$ in FIG. 7, showing that a large quantity of hydrogen was comprised within the wetting layer.

Therefore, if there is a wetting layer, H or OH within the wetting layer is excited by factors such as the radiant heat of the plasma and is emitted as water or hydrogen gas during the subsequent formation of the aluminum layers, so that these gases do not form solid solutions in the aluminum layers and thus they collect at the boundary surface between the layers, reducing the adhesiveness and causing voids.

In this manner, it was determined that, although such a wetting layer (titanium layer) is usually formed to improve the wettability with respect to the aluminum layers, it is the cause of further problems in subsequent heating steps. In particular, the wafer might absorb a certain amount of moisture locally after the contact holes have been formed, in which case the presence of the wetting layer makes it easy for contact failures and electromigration failures to occur due to voids in those damp portions.

Furthermore, if there is a wetting layer, the titanium that forms this wetting layer reacts with the aluminum during the formation of the first aluminum layer to form compounds such as $Al_3Ti$ locally. The presence of such compounds during the formation of the second aluminum film would adversely affect the surface-flow characteristics of the aluminum, making it likely that voids will occur due to incomplete filling of the aluminum. This phenomenon is particularly likely to occur in the entrance apertures of the contact holes, causing a fault called pinch-off. This pinch-off can easily occur in the filling of contact holes having a diameter of 0.3 $\mu$m or less.

In addition, the presence of a wetting layer could result in the titanium of that wetting layer reducing the titanium oxide that is present within the barrier layer, deteriorating the barrier capabilities of that barrier layer.

For the above reasons, it is preferable that no wetting layer is formed, at least for the first layer of wiring layers. If there is no wetting layer, there is no necessity for the step of forming such a layer, which shortens the fabrication process.

The present invention ensures that there is sufficient adhesiveness between the barrier layer and the first aluminum layer, even when no wetting layer is formed therebetween, by degassing the interlayer dielectric after the contact hole is formed and also by including a step of cooling the wafer thoroughly before the aluminum layers are formed, as described above. Since any gases such as hydrogen, nitrogen, or oxygen comprised within the layers under the first aluminum layer are thoroughly removed by this degassing process, and these gases cannot pass into the first aluminum layer, the surface of the first aluminum is extremely smooth. This means that aluminum will flow smoothly over the surface of the first aluminum layer during the formation of the second aluminum layer, to form a well-filled layer.

The reasons why the first and second aluminum layers 34 and 35 of the present invention fill the contact holes in such a favorable manner are thought to be as follows:

(a) The degassing step ensures that any gaseous components such as water or nitrogen that may be comprised within the interlayer dielectric, particularly the BPSG film, are released therefrom, preventing the generation of gases from the BPSG layer 30 and the barrier layer 33 during the subsequent formation of the first aluminum layer 34 and the second aluminum layer 35. This makes it possible to increase the adhesiveness between the barrier layer 33 and the first aluminum layer 34 and thus form a layer with a good step coverage.

(b) In addition to the effects of the degassing step, the adhesiveness of the first aluminum layer 34 is further increased by setting the temperature of the substrate to a comparatively low level of 200° C. or less during the formation of the first aluminum layer 34, so that no moisture or nitrogen can be ejected from the BPSG layer 30 and the barrier layer 33.

(c) Furthermore, the first aluminum layer 34 itself acts to suppress the generation of gases from underlying layers when the substrate temperature rises, so that the subsequent second aluminum layer 35 can be formed at a comparatively high temperature to ensure that it will flow and diffuse in a favorable manner.

As described above, the present invention makes it possible to fill contact holes of up to approximately 0.2 $\mu$m with aluminum or aluminum alloy alone, thus improving reliability and yield, by including at least a degassing step and a cooling step before the sputtering of the aluminum layers, and also by forming the aluminum layers in sequence within the same chamber. It has also be confirmed that there is no segregation of metals such as copper nor any abnormal growth of crystals grains within the aluminum layers that form the contact portions, which is advantageous from the viewpoint of reliability such as migration.

Note that the above embodiment was described with reference to a semiconductor device comprising an n-channel type of MOS element, but it could equally well be applied to a semiconductor device comprising a p-channel or CMOS element.

Note also that the above embodiment was described with reference to a contact hole in a first layer that is filled with an aluminum layer, but it has been confirmed that similar effects can be achieved when filling contact holes in second and subsequent wiring layers (second layer, third layer, fourth layer, etc.).

What is claimed is:

1. A semiconductor device comprising:

a semiconductor substrate including an electronic element;

an interlayer dielectric formed on said semiconductor substrate from which gaseous components have been removed by thermal processing;

a contact hole formed in said interlayer dielectric; and a barrier layer formed on said interlayer dielectric and said contact hole, wherein said barrier layer includes a conductive film and a barrier film, said conductive film is made of a refractory metal or silicide thereof, an aluminum layer is formed on said barrier layer and fills said contact hole, said aluminum layer including one of aluminum and an alloy in which aluminum is the main component, and said barrier layer includes an oxide of the refractory metal forming the conductive film and being provided in islands.

2. The semiconductor device as defined by claim 1, wherein no wetting layer is provided between said barrier layer and said aluminum layer, to increase wettability with respect to said aluminum layer.

* * * * *